United States Patent
Arai

(10) Patent No.: US 7,956,423 B2
(45) Date of Patent: Jun. 7, 2011

(54) SEMICONDUCTOR DEVICE WITH TRENCH GATE AND METHOD OF MANUFACTURING THE SAME

(75) Inventor: Takao Arai, Kanagawa (JP); Sachiko Shirai, legal representative, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/453,888

(22) Filed: May 26, 2009

(65) Prior Publication Data

US 2009/0294870 A1 Dec. 3, 2009

(30) Foreign Application Priority Data

May 27, 2008 (JP) ................................. 2008-137710

(51) Int. Cl.
*H01L 21/8248* (2006.01)
*H01L 29/66* (2006.01)

(52) U.S. Cl. . 257/378; 257/367; 257/369; 257/E21.695; 257/E21.616

(58) Field of Classification Search .................. 257/262, 257/368–401, E29.255–E29.313, E29.315–E29.316, 257/E29.027–E29.028, E29.066–E29.067, 257/E29.194–E29.202

See application file for complete search history.

(56) References Cited

U.S. PATENT DOCUMENTS

| 5,821,580 | A | * | 10/1998 | Kuwahara | ...................... 257/330 |
| 6,323,518 | B1 | | 11/2001 | Sakamoto et al. | |
| 2002/0014675 | A1 | | 2/2002 | Matsumoto et al. | |

FOREIGN PATENT DOCUMENTS

| JP | 6-326320 | 11/1994 |
| JP | 2002-48651 | 2/2002 |
| JP | 3413569 | 4/2003 |

* cited by examiner

*Primary Examiner* — N Drew Richards
*Assistant Examiner* — Mamadou Diallo
(74) *Attorney, Agent, or Firm* — McGinn IP Law Group, PLLC

(57) ABSTRACT

A method of a semiconductor device, which includes an insulated-gate FET and an electronic element, includes three steps. The first step is the step of forming a trench gate of the insulated-gate FET in a first region of a semiconductor base and a trench element-isolation layer in a second region of the semiconductor base, simultaneously. The second step is the step of forming a first diffusion layer of the insulated-gate FET on a side of the trench gate and a second diffusion layer of the electronic element in a region surrounded by the trench element-isolation layer, simultaneously. The third step is the step of forming a third diffusion layer of the insulated-gate FET in the first diffusion layer and a fourth diffusion layer of the electronic element in the second diffusion layer, simultaneously.

20 Claims, 20 Drawing Sheets

SEMICONDUCTOR DEVICE WITH TRENCH GATE AND METHOD OF MANUFACTURING THE SAME

INCORPORATED BY REFERENCE

This application is based upon and claims the benefit of priority from Japanese patent application No. 2008-137710 filed on May 27, 2008, the disclosure of which is incorporated herein in its entirety by reference.

BACKGROUND OF THE INVENTION

1. Field of the Invention

The present invention relates to a semiconductor device and a method of manufacturing the same, and particularly relates to a semiconductor device with a trench gate and a method of manufacturing the same.

2. Description of Related Art

With a recent technical development, a semiconductor device having a protection feature is put into practical use. For example, Japanese Patent JP-B 3,413,569 (corresponding to U.S. Pat. No. 6,323,518 (B1)) discloses an insulated-gate semiconductor device having a temperature detecting element as an overheat protection feature and a method of manufacturing thereof.

FIG. 1 is a schematic cross-sectional view showing a structure of the semiconductor device disclosed in Japanese Patent JP-B 3,413,569. This insulated-gate semiconductor device includes a trench-type insulated-gate semiconductor element such as a trench-gate MOSFET, and a diode concerning a gate protection for this trench-type insulated-gate semiconductor element. In the trench-type insulated-gate semiconductor element, a plurality of trenches 104 is formed in a main surface of a semiconductor layer 102 on a semiconductor substrate 101. Gate layers 110 connected to a first electrode 113a are formed inside and outside of the plurality of trenches 104 through gate insulating films 105. In a surface opposite to the main surface of the semiconductor layer 102, a second electrode 114 is formed. A diffusion layer 106 connected to a third electrode 107 is formed between the gate layers 110. The gate layer 110 includes a gate layer region on the trenches 104 and a gate layer region extending outside the trenches 104. The first electrode 113a and the gate layer 110 are connected to each other at the gate layer region extending outside the trenches 104. The diode (composed of 121 to 123) is formed on an insulating film 109 formed in the main surface of the semiconductor layer 102 of the semiconductor substrate 101. A film thickness of the diode is less than a film thickness of the gate layer region extending outside the trenches 104 to connect the first electrode 113a with the gate layer 110. That is, in the insulated-gate semiconductor device, a temperature detecting element for overheat protection includes polycrystalline silicon diode (121 to 123) provided on the oxide film 109. The temperature is then detected by means of a forward voltage value of the polycrystalline silicon diode (121 to 123) for the temperature detection.

It is possible to use a bipolar transistor as the temperature detecting element. For example, Japanese Laid-Open Patent Application JP-A 2002-48651 (corresponding to U.S. Pat. No. 6,733,174(B2)) discloses a semiconductor temperature detecting circuit with a bipolar transistor for detecting the temperature. FIG. 2 is a circuit diagram showing a structure of the temperature detecting element (the temperature sensor) of the semiconductor temperature detecting circuit disclosed in Japanese Laid-Open Patent Application JP-A 2002-48651. This temperature detecting element is represented by the circuit diagram using a three-stage Darlington connection, which includes NPN bipolar transistors Tr1 to Tr3.

As a related technique, Japanese Laid-Open Patent Application JP-A-Heisei 06-326320 discloses a semiconductor device and a method for manufacturing thereof. The semiconductor device includes a first-conduction-type semiconductor substrate, a first-conduction-type semiconductor layer, a first-conduction-type first region, a first-conduction-type second region, a second-conduction-type base region of a power semiconductor device, a first-conduction-type source region of the power semiconductor device, a gate trench, a gate oxide film of the power semiconductor device, a gate electrode of the power semiconductor device, a second-conduction-type buried isolation layer, and an element-isolation trench. The first-conduction-type semiconductor layer is formed on the first-conduction-type semiconductor substrate. The first-conduction-type first region is formed in the first-conduction-type semiconductor layer and includes the power semiconductor element. The first-conduction-type second region is formed in the first-conduction-type semiconductor layer and includes a control circuit element. The second-conduction-type base region of the power semiconductor device is formed in a surface region of the first region. The first-conduction-type source region of the power semiconductor element is formed in the surface region of the first region and surrounded by the second-conduction-type base region. The gate trench is formed in the first-conduction-type source region, and extends from the main surface of the first-conduction-type semiconductor layer thereinto to pass through the second-conduction-type base region. The gate oxide film of the power semiconductor device is formed on a side wall of the gate trench. The gate electrode of the power semiconductor element is formed in the gate trench and placed on the gate oxide film. The second-conduction-type buried isolation layer is formed in the second region, or between the first-conduction-type semiconductor substrate and the second region. The element-isolation trench is formed at least between the first region and the second region, and extends from the main surface of the first-conduction-type semiconductor layer to the second-conduction-type buried isolation layer. Both the second-conduction-type buried isolation layer and the element-isolation trench isolate the second region of the first-conduction-type semiconductor layer from the other regions of the first-conduction-type semiconductor layer.

However, the inventor's recent research has revealed this time, that the temperature detecting element formed in the semiconductor substrate has the problems as follows.

FIG. 1 shows only a single silicon diode for the temperature detection. Typically, however, a plurality of diodes connected in series to one another is used for the temperature detecting element in order to increase the temperature coefficient of the temperature detecting element. As shown in this example, in the case where the silicon diode for the temperature detection is the polycrystalline silicon diode, the oxide film 109 having a poor thermal conductivity lies between the diode and an MOSFET (Metal-Oxide Semiconductor Field-Effect Transistor) that is a trench-type insulated-gate semiconductor element. In this case, the thermal conduction to the diode is prone to be poor with regard to the heat generated at a MOSFET side in a short period of time. This increases the difference in temperature between the MOSFET and the diode, and thus an error can easily occur in the temperature detection. This leads to a shortcoming in which it becomes difficult to protect the MOSFET more adequately.

A diode or a bipolar transistor using a diffusion layer can be contemplated as a temperature detecting element that can be formed without interposing the oxide film. In the case of using such an element having the diffusion layer (the device formed on the surface of the semiconductor substrate), however, a field plate is required to be provided on the peripheral diffusion layer to increase a withstand voltage of the peripheral diffusion layer so that the withstand voltage at each of the peripheral junction portions of the temperature detecting element do not decrease (the leakage current do not increase at each of the peripheral junction portions). This is because, if mobile ions penetrate into a chip surface to make the surface withstand voltage of the peripheral junction portion lower, the characteristic of the temperature detecting element is varied, thereby being unable to implement the protection more adequately and precisely.

In order to implement the protection more adequately and precisely, the inventor has considered that a plurality of stages of bipolar transistors can be used for a temperature detecting element. Because the inventor's recent research has found that an semiconductor device, which is represented by the circuit diagram using the Darlington connection as shown in FIG. 2, possesses characteristics as the temperature detecting element, shown in FIGS. 3 and 4. FIG. 3 is a graph showing a voltage-current characteristic of the temperature detecting element. FIG. 4 is a graph showing the temperature dependence of the voltage of the temperature detecting element when the current is 10 µA. As shown in these figures, it has found that this temperature detecting element possesses the characteristics similar to those of the temperature detecting element with the diodes in three-stage series connection.

When the plurality of stages of bipolar transistors is used, for example, as shown in FIG. 2, a field plate is required for each bipolar transistor in order to implement the protection more adequately and precisely. However, when the field plate is provided for each temperature detecting element as mentioned above, a problem arises that a layout area of the temperature detecting element (the protected device) becomes larger.

SUMMARY

The present invention seeks to solve one or more of the above problems, or to improve upon those problems at least in part.

In one embodiment, a method of a semiconductor device which includes an insulated-gate FET (Field Effect Transistor) and an electronic element, includes: forming a trench gate of the insulated-gate FET in a first region of a semiconductor base and a trench element-isolation layer in a second region of the semiconductor base, simultaneously; forming a first diffusion layer of the insulated-gate FET on a side of the trench gate and a second diffusion layer of the electronic element in a region surrounded by the trench element-isolation layer, simultaneously; and forming a third diffusion layer of the insulated-gate FET in the first diffusion layer and a fourth diffusion layer of the electronic element in the second diffusion layer, simultaneously.

In the method of manufacturing the semiconductor device according to the present invention, the element-isolation layer of the electronic element is formed at the same time when the trench gate of the insulated-gate FET is formed, and the diffusion layers of the electronic element are formed at the same time when the diffusion layers of the insulated-gate FET are formed. That is, the electronic element and the insulated-gate FET can be formed simultaneously on the same semiconductor substrate by using the manufacturing processes of the insulated-gate FET without adding any processes. Therefore, it is possible to reduce the cost and time for manufacturing the semiconductor device with the electronic element. In addition, the element-isolation layer has the same structure as the trench gate. That is, it seems that the element-isolation layer has the structure similar to that of the STI (Shallow Trench Insulation). Thus, in that region, the field plate can be reduced. As a result, a layout area for a part regarding the element isolation can be decreased in the electronic element.

In another embodiment, a semiconductor device includes: an insulated-gate FET (Field Effect Transistor); and an electronic element. The insulated-gate FET includes: a trench gate formed in a semiconductor base, a first diffusion layer formed on a side of the trench gate, and a third diffusion layer formed in the first diffusion layer. The electronic element includes: a second diffusion layer having an approximately same impurity concentration and depth profile as the first diffusion layer, a fourth diffusion layer having an approximately same impurity concentration and depth profile as the third diffusion layer, and formed in the second diffusion layer, and a trench element-isolation layer having an approximately same depth as the trench gate, and formed so as to surround the second diffusion layer. Each of the trench gate and the trench element-isolation layer includes: an insulating layer formed in a trench, and a conductive layer buried in the insulating layer.

In the semiconductor device according to the present invention, the electronic element is isolated by using the element-isolation layer which has the same structure as the trench gate similar to that of the STI (Shallow Trench Insulation). Therefore, in that region, the junction between the diffusion layers is not externally exposed. Thus, since the field plate can be reduced in that region, a layout area for a part regarding the element isolation can be decreased in the electronic element.

According to the present invention, a layout area in the electronic elements can be minimized regarding the portion for isolating the elements.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Referring to the attached drawings, the embodiments of a semiconductor device according to the present invention will be described below.

First Embodiment

Figure 1:
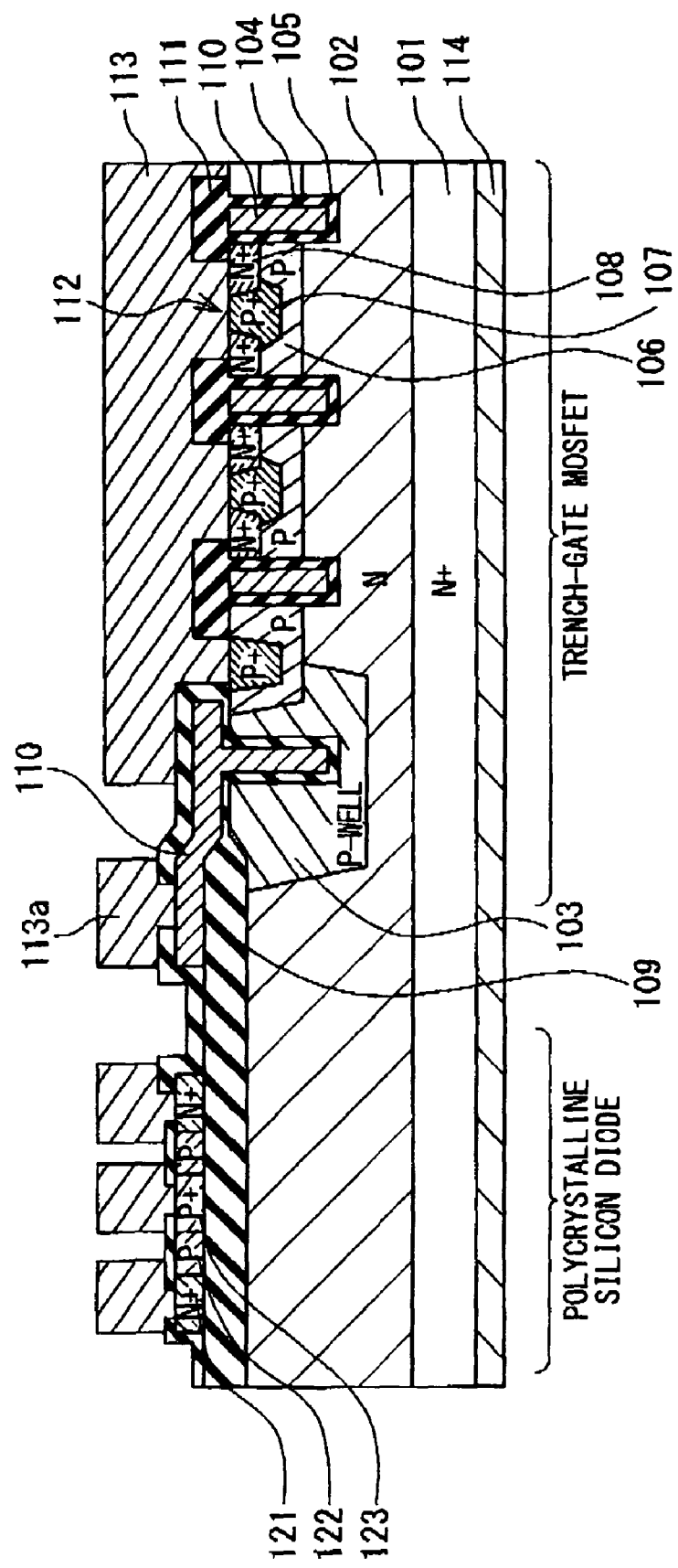
FIG. 1 is a schematic cross-sectional view showing a structure of a semiconductor device disclosed in Japanese Patent JP-B 3,413,569.
Figure 2:
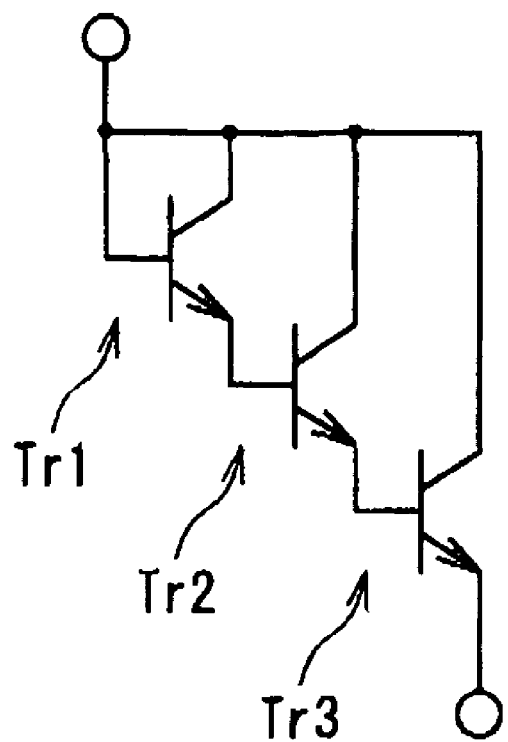
FIG. 2 is a circuit diagram showing a structure of a temperature detecting element of a semiconductor temperature detecting circuit disclosed in Japanese Laid-Open Patent Application JP-A 2002-48651.
Figure 3:
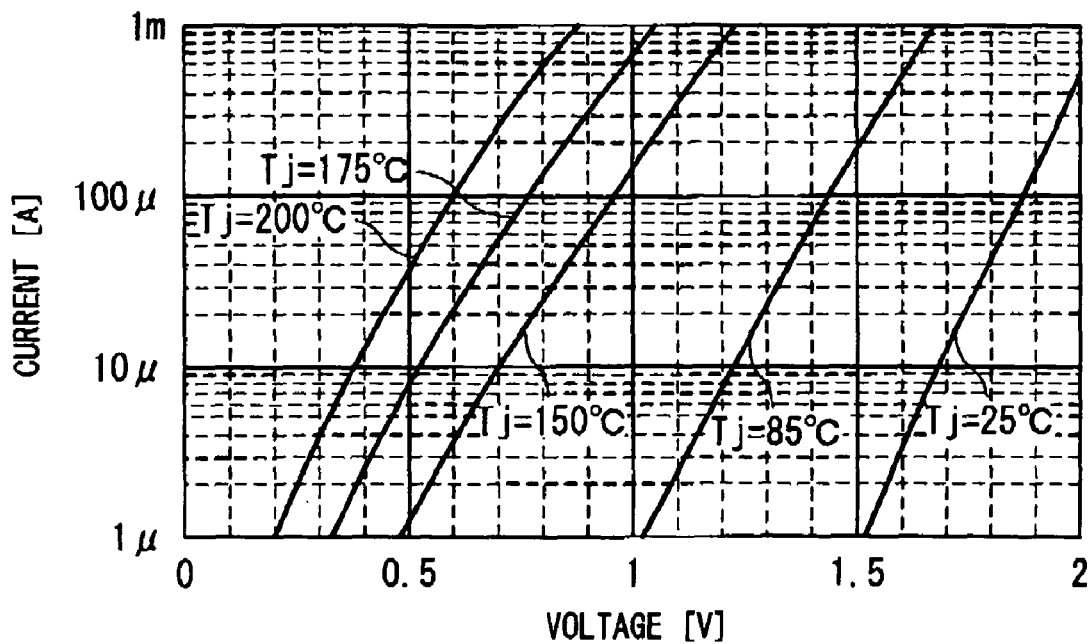
FIG. 3 is a graph showing a voltage-current characteristic of a temperature detecting element.
Figure 4:
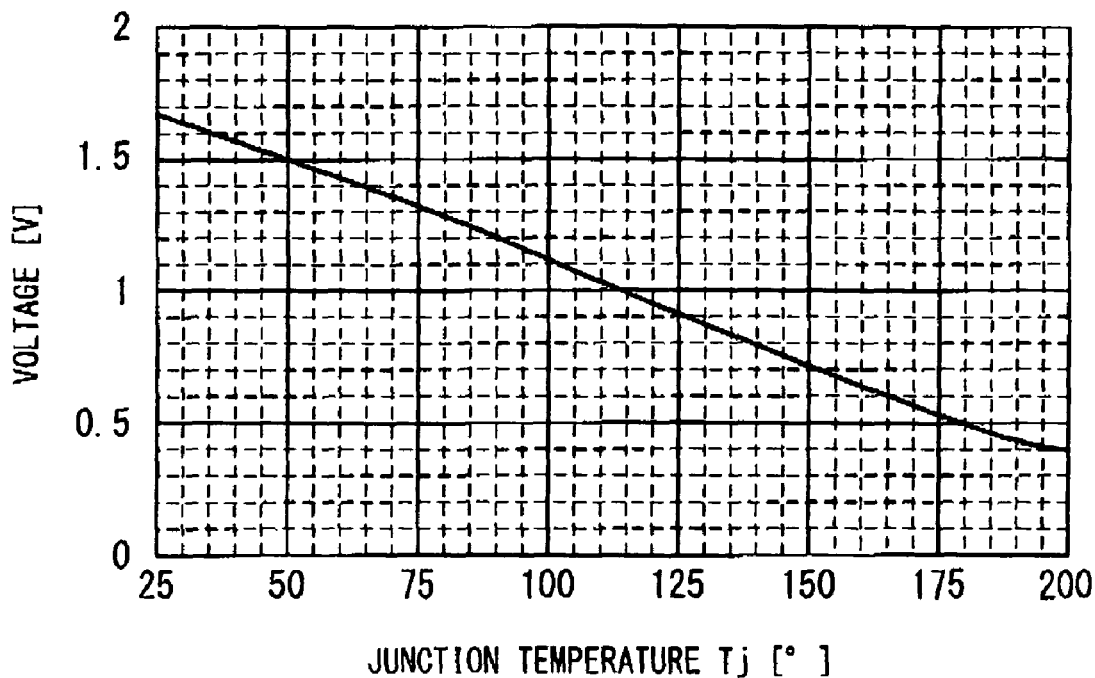
FIG. 4 is a graph showing the temperature dependence of the voltage of the temperature detecting element.
Figure 5:
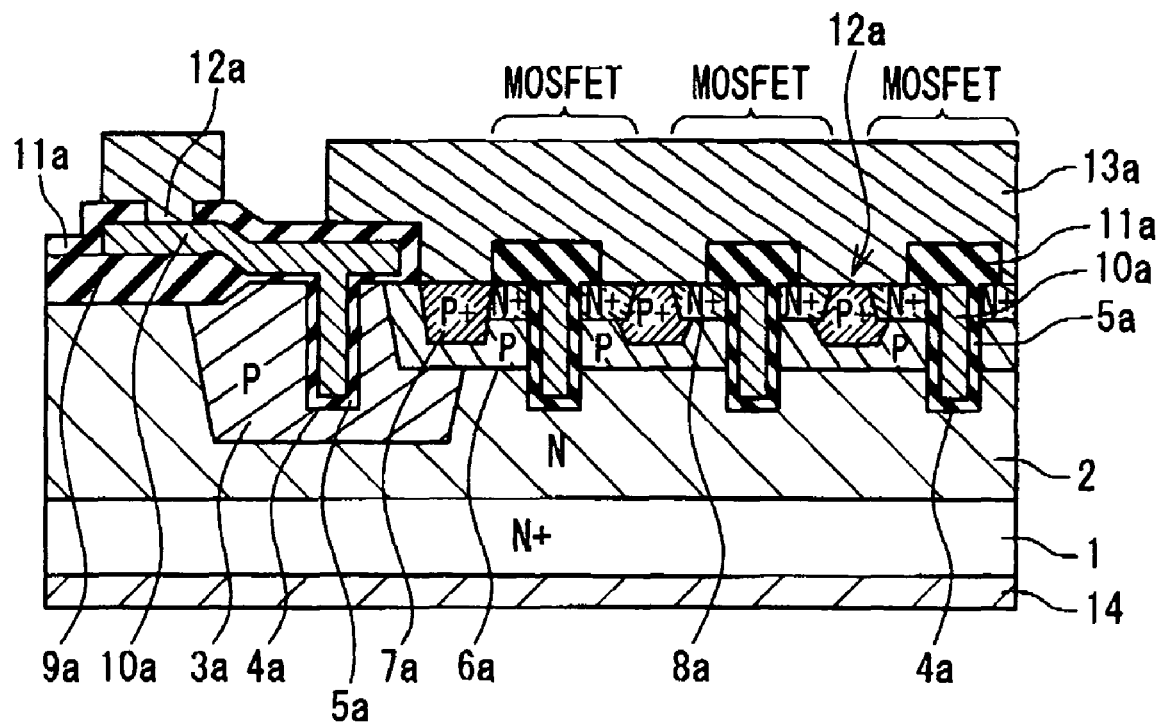
FIG. 5 is a cross sectional view showing a structure of a semiconductor device according to a first embodiment of the present invention.
Figure 6:
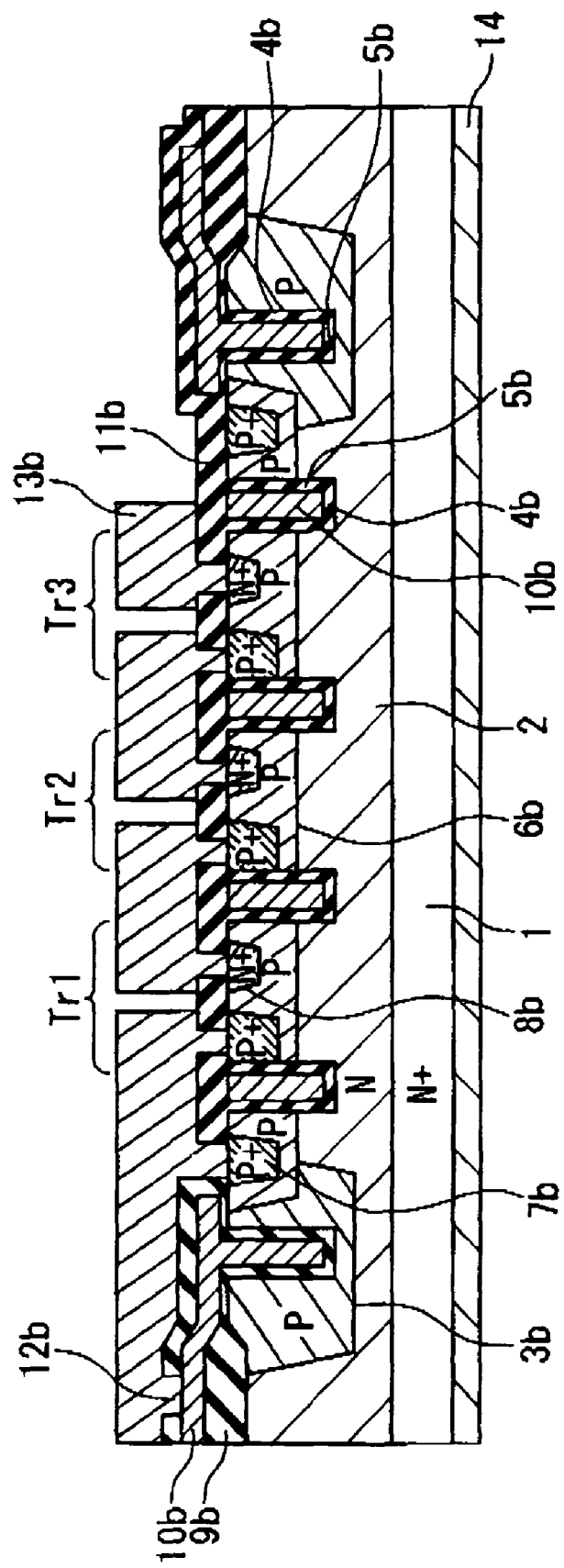
FIG. 6 is a cross sectional view showing a structure of the semiconductor device according to the first embodiment of the present invention.
Figure 7:
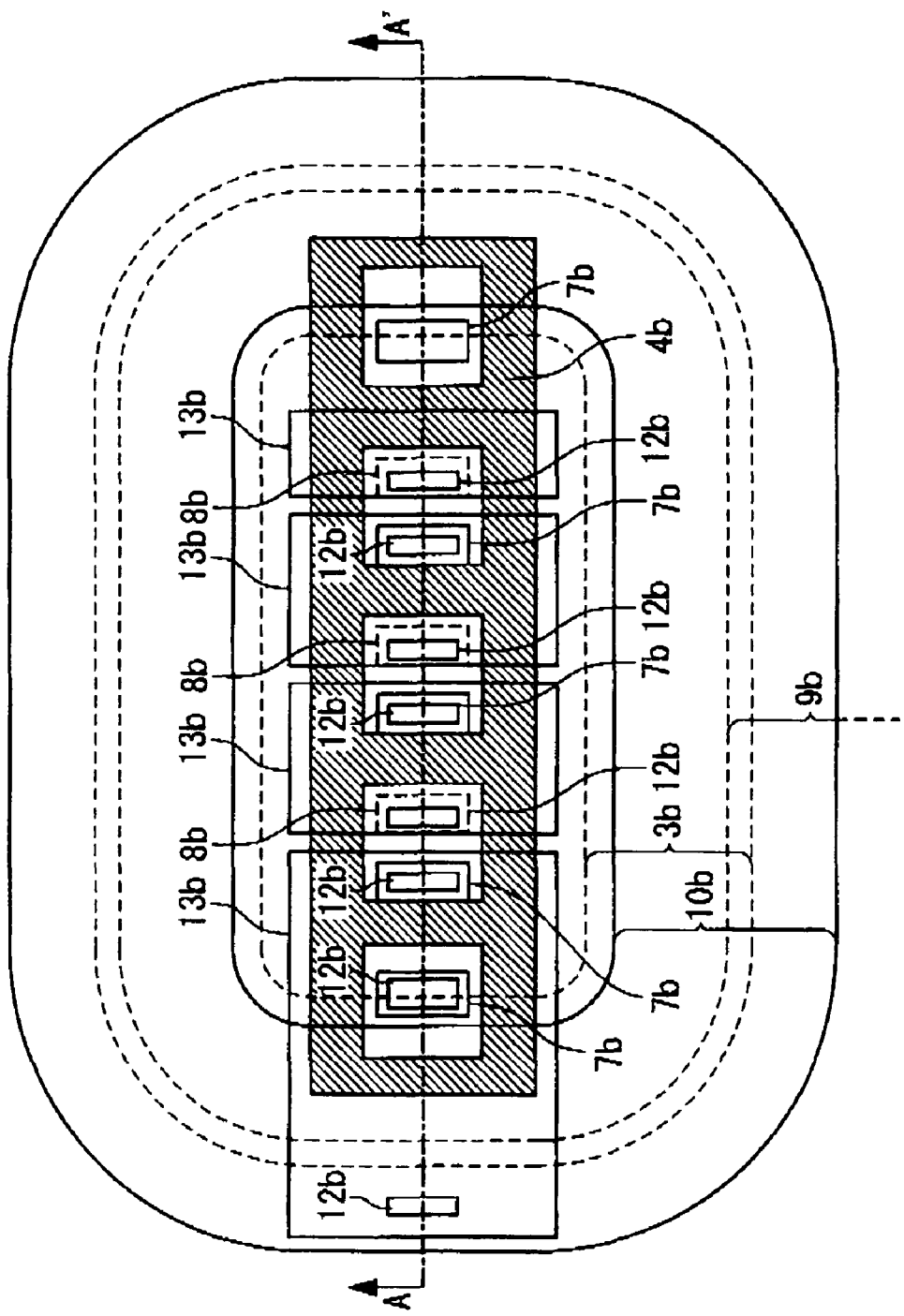
FIG. 7 is a plan view showing a structure of the semiconductor device according to the first embodiment of the present invention.

A structure of a semiconductor device according to a first embodiment of the present invention will be described. FIGS. 5 and 6 are cross sectional views showing a structure of the semiconductor device according to the first embodiment. FIG. 7 is a top plan view showing the structure of the semiconductor device according to the first embodiment. Here, FIG. 5 shows a circuit portion including trench-gate MOSFETs. Each of FIGS. 6 and 7 shows a circuit portion including a temperature detecting element. FIG. 6 is a cross sectional view along the line AA' in FIG. 7. While the circuit portion including the trench-gate MOSFETs (FIG. 5) and the circuit portion including the temperature detecting element (FIG. 6) are depicted in the separate figures, they are mounted in the same semiconductor substrate (same chip). In FIGS. 5, 6 and 7, components produced in a same process are marked (numbered) similarly. However, "a" is added to each reference numeral in the circuit portion including the trench-gate MOSFETs, and "b" is added to each reference numeral in the circuit portion including the temperature detecting element.

Referring to the cross sectional view in FIG. 5 (the circuit portion including the trench-gate MOSFETs), an N-type epitaxial layer 2 (a semiconductor base) is formed on an $N^+$ semiconductor substrate 1. Trenches 4a are provided in the upper portion of the N-type epitaxial layer 2. In each trench 4a, a polycrystalline silicon layer 10a is buried through a gate oxide film 5a. A P-well diffusion layer 3a and P-type diffusion layers 6a (a first diffusion layers) are formed on the N-type epitaxial layer 2. A $P^+$ diffusion layer 7a and $N^+$ diffusion layers 8a (a third diffusion layers) are formed on the P-type diffusion layer 6a.

On a peripheral portion of the circuit portion including the trench-gate MOSFETs, an oxide film 9a, which is a LOCOS (a Local Oxidization of Silicon) oxide film, is formed on a peripheral side of the P-well diffusion layer 3a. The polycrystalline silicon layer 10a is brought up to an outside surface at the peripheral portion so as to cover a surface of the junction between the N-type epitaxial layer 2 and the P-well diffusion layer 3a through the oxide film 9a. An interlayer insulating-film 11a is formed on the polycrystalline silicon layer 10a. A part of the interlayer insulating-film 11a is removed to form a contact portion 12a. An aluminum electrode 13a is formed so as to cover the contact portion 12a. A rear electrode 14 is formed on a side of the $N^+$ semiconductor substrate 1 where the N-type epitaxial layer 2 is not formed.

The trench-gate MOSFET includes the polycrystalline silicon layer 10a (a gate) and the gate oxide film 5a, the $N^+$ diffusion layer 8a (a source) and the P-type diffusion layer 6a (a channel) on the both sides of the polycrystalline silicon layer 10a, and the N-type epitaxial layer 2 and the $N^+$ semiconductor substrate 1 (a drain). A plurality of trench-gate MOSFETs is provided in the circuit portion including the trench-gate MOSFETs.

The circuit portion including the temperature detecting element shown in FIG. 6 is provided for measuring the temperature of the circuit portion including the trench-gate MOSFETs shown in FIG. 5. Accordingly, the temperature detecting element is typically formed within the region where the trench-gate MOSFETs are formed. In addition, the circuit portion including the temperature detecting element is only a variation of the layout of the circuit portion including the trench-gate MOSFETs. The circuit portion including the temperature detecting element is thus manufactured by a method of manufacturing the circuit portion including the trench-gate MOSFETs. Therefore, the circuit portion including the temperature detecting element can be manufactured without adding any processes to the processes of manufacturing the circuit portion including the trench-gate MOSFETs, and thereby mounting them in conjunction with each other.

Referring to the cross sectional view in FIG. 6 (the circuit portion including the temperature detecting element), the N-type epitaxial layer 2 is formed on the $N^+$ semiconductor substrate 1. Trenches 4b are provided in the upper portion of the N-type epitaxial layer 2. In each trench 4b, a polycrystalline silicon layer 10b is buried through a gate oxide film 5b. A P-well diffusion layer 3b (a fifth diffusion layer) and P-type diffusion layers 6b (a second diffusion layers) are formed on the N-type epitaxial layer 2. A $P^+$ diffusion layer 7b and an $N^+$ diffusion layer 8b (a fourth diffusion layer) are formed on the P-type diffusion layer 6b. A rear electrode 14 is formed on a rear surface of the $N^+$ semiconductor substrate 1.

Referring to the diagrammatic plan view in FIG. 7 (the circuit portion including the temperature detecting element), on a peripheral portion of the circuit portion, a field oxide film 9b is formed on a peripheral side of the P-well diffusion layer 3b. The field oxide film 9b is identical with the field oxide film 9a of the trench-gate MOSFET. That is, the field oxide film is formed on the border between the circuit portion including the trench-gate MOSFETs and the circuit portion including the temperature detecting element; and the field oxide films 9a and 9b represent the field oxide film at a side of the trench-gate MOSFET and a side of the temperature detecting element, respectively. The trench-gate MOSFETs (not shown) are formed around the temperature detecting element illustrated in FIG. 7. The polycrystalline silicon layer 10b is brought up to the outside surface at the peripheral portion so as to cover the surface of the junction between the N-type epitaxial layer 2 and the P-well diffusion layer 3b, and extends on the field oxide film 9b. The field oxide film 9b and the polycrystalline silicon layer 10b existing thereon are formed so as to surround the circuit portion including the temperature detecting element as a whole, and serve as so-called field plates. An interlayer insulating-film 11b is formed on the polycrystalline silicon layer 10b. A part of the interlayer insulating-film 11b is removed to form a contact portion 12b. An aluminum electrode 13b is formed so as to cover the contact portion 12b.

A bipolar transistor includes the P-type diffusion layer 6b and the P+ diffusion layer 7b as a base region of the bipolar transistor, the N+ diffusion layer 8b as an emitter region of the bipolar transistor, and the N+ semiconductor substrate 1 and the N-type epitaxial layer 2 as a collector region of the bipolar transistor. A plurality of (three in FIG. 6) bipolar transistors is provided in the circuit portion including the temperature detecting element. A portion of the trench 4b (the gate oxide film 5b with the polycrystalline silicon layer 10b buried therein) serves as a device isolation layer that electrically isolates the bipolar transistors. The trench 4b is thus provided so as to surround the bipolar transistor. The polycrystalline silicon layer 10b buried in the trench 4b is electrically connected to the P-well diffusion layer 3b through the aluminum electrode 13b, the P+ diffusion layer 7b, and the P-type diffusion layer 6b.

Figure 8:
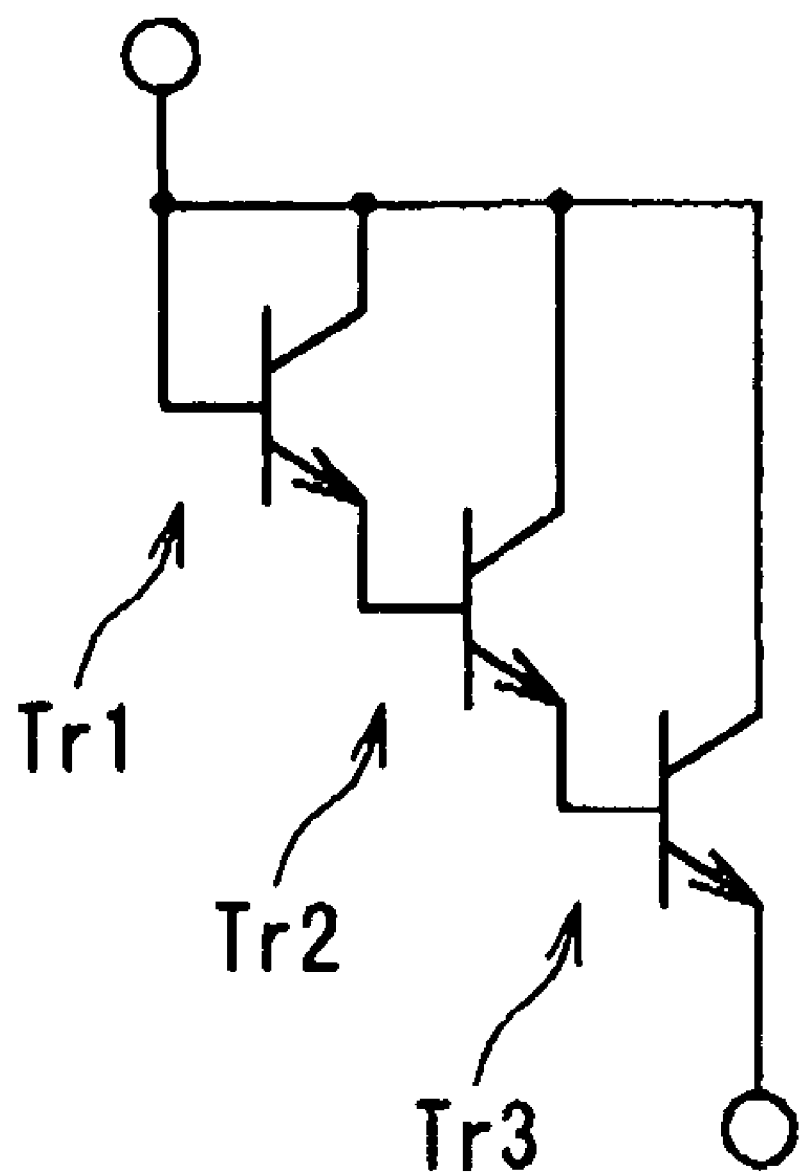
FIG. 8 is a circuit diagram showing an equivalent circuit of the temperature detecting element in FIG. 6.
Figure 9:
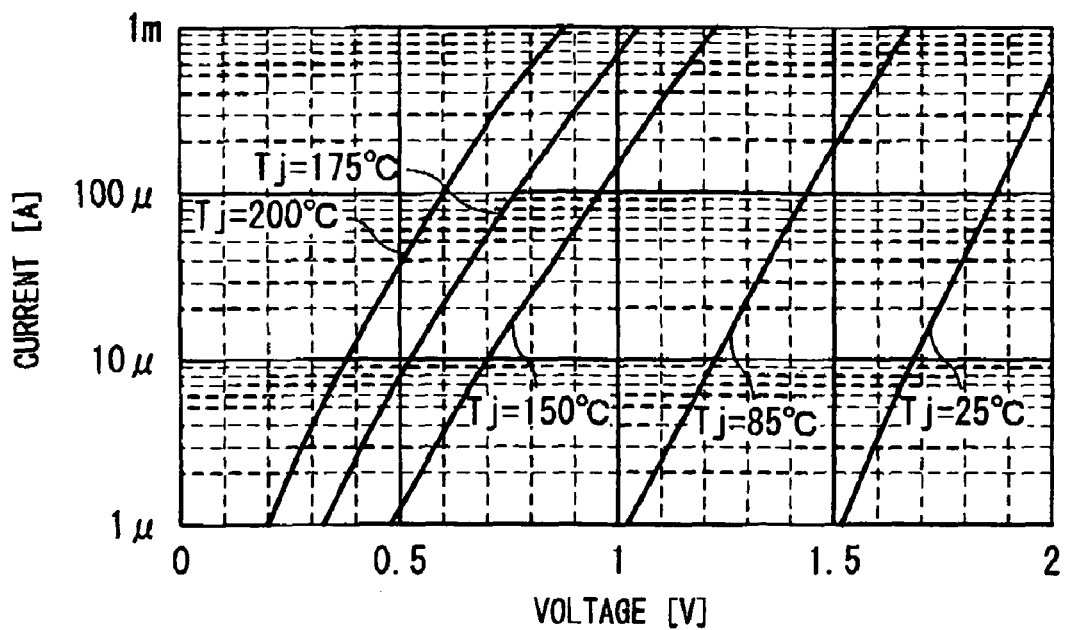
FIG. 9 is a graph showing a voltage-current characteristic of the temperature detecting element in FIG. 6.
Figure 10:
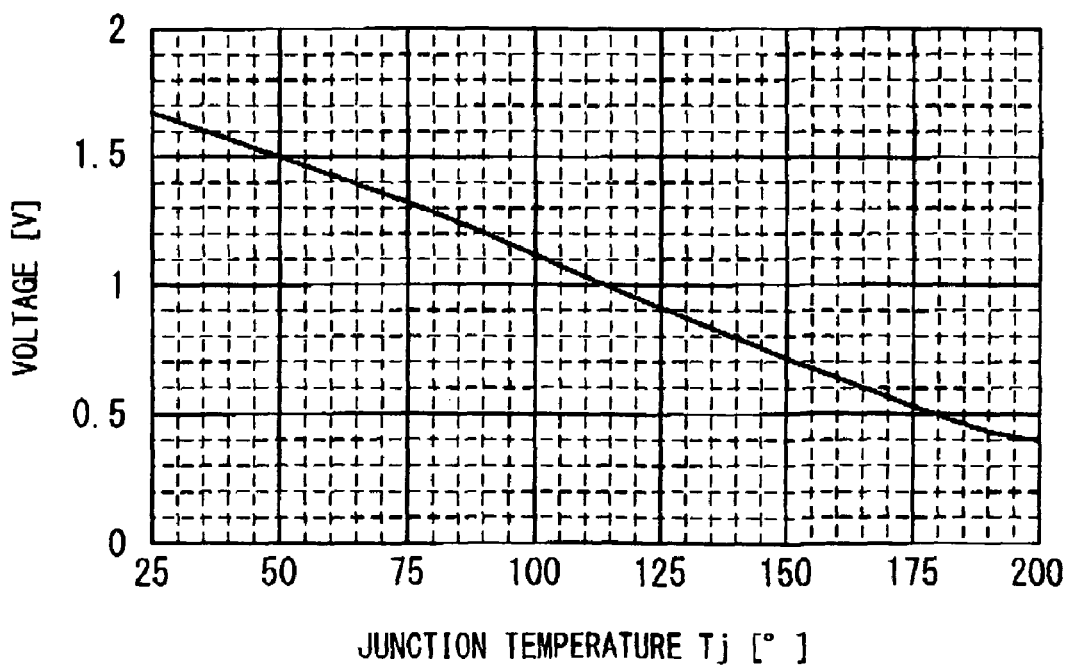
FIG. 10 is a graph showing a temperature characteristic of the voltage of the temperature detecting element in FIG. 6.

FIG. 8 is a circuit diagram showing an equivalent circuit of the temperature detecting element in FIG. 6. The temperature detecting element has a structure in which three bipolar transistors are in three-stage Darlington connection. The temperature detecting element utilizes a voltage-current characteristic of the bipolar transistors in the three-stage Darlington connection. FIG. 9 is a graph showing the voltage-current characteristic of this temperature detecting element. The temperature detecting element detects the temperature by measuring a voltage when a certain constant current is applied. FIG. 10 is a graph showing a temperature characteristic of the voltage of this temperature detecting element when the current is 10 μA. The figure shows that the voltage varies linearly with the temperature.

As shown in FIGS. 6 and 7, the polycrystalline silicon layer 10b on the peripheral side acts as a field plate. This raises a withstand voltage of the surface of the junction between the N-type epitaxial layer 2 and the P-well diffusion layer 3b. Therefore, even if mobile ions penetrate into the chip surface, it does not lower the withstand voltage of this portion. In addition, the junction between the N-type epitaxial layer 2 and the P-type diffusion layer 6b does not exist on the chip surface due to the existence of the trench 4b as an element-isolation layer. Therefore, even if mobile ions penetrate into the chip surface, it does not lower the withstand voltage of this portion.

The withstand voltage for the isolation between the P-type diffusion layers 6b, which are electrically isolated by the trench 4b (serving as an element-isolation layer), is determined by a punch-through withstand voltage of PNP junction in the order of the P-type diffusion layer 6b, the N-type epitaxial layer 2, and the P-type diffusion layer 6b. This withstand voltage for the isolation may be a dozen or so volts. This withstand voltage is insufficient to isolate all devices, while it is sufficient to isolate the temperature detecting device whose potential difference is in the order of several volts.

As described above, in the temperature detecting element according to the present embodiment, the field plate is provided so as to entirely surround the plurality of bipolar transistors, and thus no field plate is needed to be provided for each bipolar transistor. This provides an effect that a layout area as the temperature detecting element can be reduced. In addition, the trench 4b provides insulation between the bipolar transistors, thereby enabling the insulation in a small area. Therefore, also in this regard, the effect is obtained that the layout area can be further reduced.

A method of manufacturing the semiconductor device according to the present embodiment will now be described below. FIGS. 11 to 15 are cross sectional views showing a method of manufacturing the semiconductor device according to the present embodiment. Each figure shows the circuit portion including the temperature detecting element (hereinafter referred to as "a temperature detecting element region") on a left side and the circuit portion including the trench-gate MOSFETs (hereinafter referred to as "a MOSFET region") on a right side, respectively.

Figure 11:
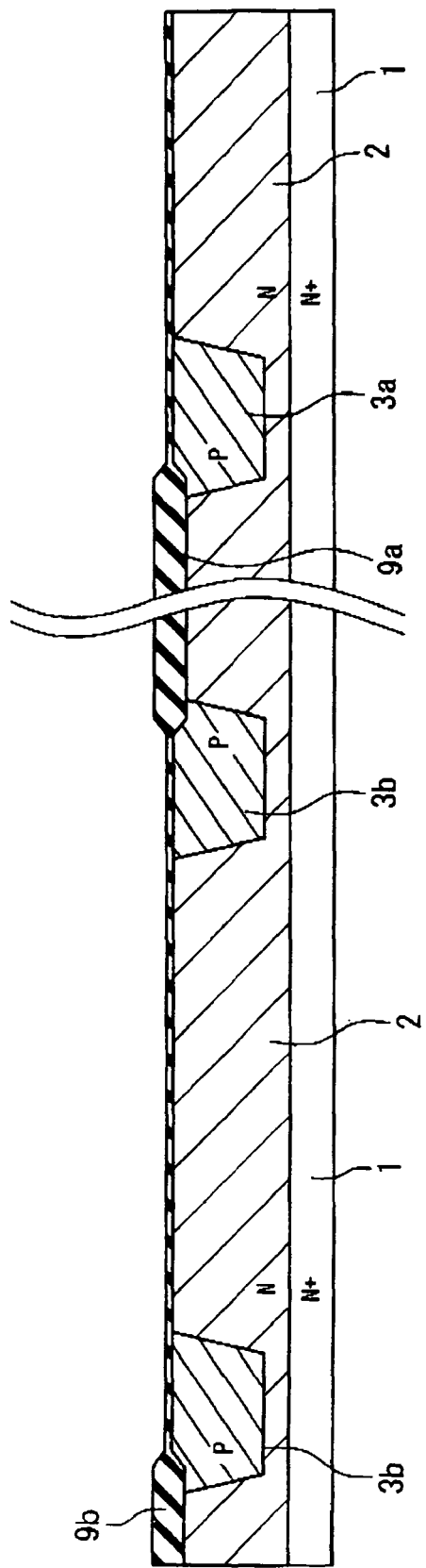
FIG. 11 is a cross sectional view showing a method of manufacturing the semiconductor device according to the first embodiment of the present invention.

As shown in FIG. 11, the N-type epitaxial layer 2 is firstly grown on the N+ semiconductor substrate 1. Then, P-type impurities are ion-implanted into the N-type epitaxial layer 2 to form the P-well diffusion layers 3b, 3a. Subsequently, surface oxidation is implemented, and then a mask such as a nitride film (not shown) is formed to perform selective oxidation. Thereby, the field oxide films 9b, 9a are formed in both the temperature detecting element region and the MOSFET region.

Figure 12:
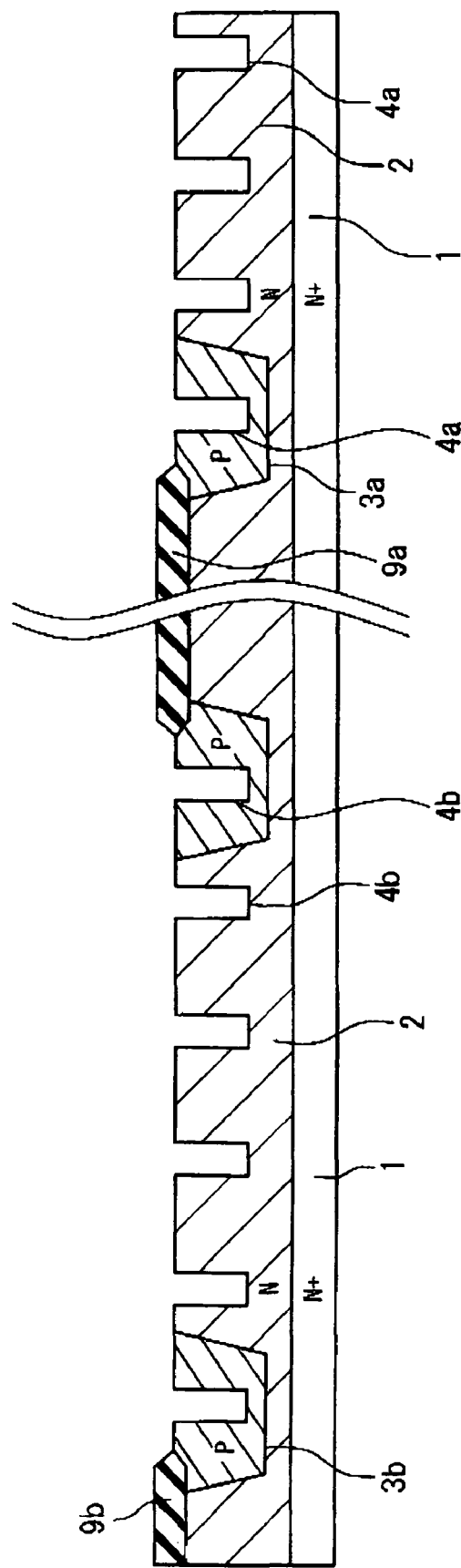
FIG. 12 is a cross sectional view showing the method of manufacturing the semiconductor device according to the first embodiment of the present invention.

As shown in FIG. 12, the trenches 4b, 4a are then formed in both the temperature detecting element region and the MOSFET region using patterned photoresist as a mask. Then, the surface oxide film is etched to leave the peripheral field oxide films 9b, 9a in both the temperature detecting element region and the MOSFET region, thereby exposing the P-well diffusion layers 3b, 3a and the N-type epitaxial layer 2 both existing internally. The trenches 4b, 4a are formed in the P-well diffusion layers 3b, 3a and the N-type epitaxial layer 2.

Figure 13:
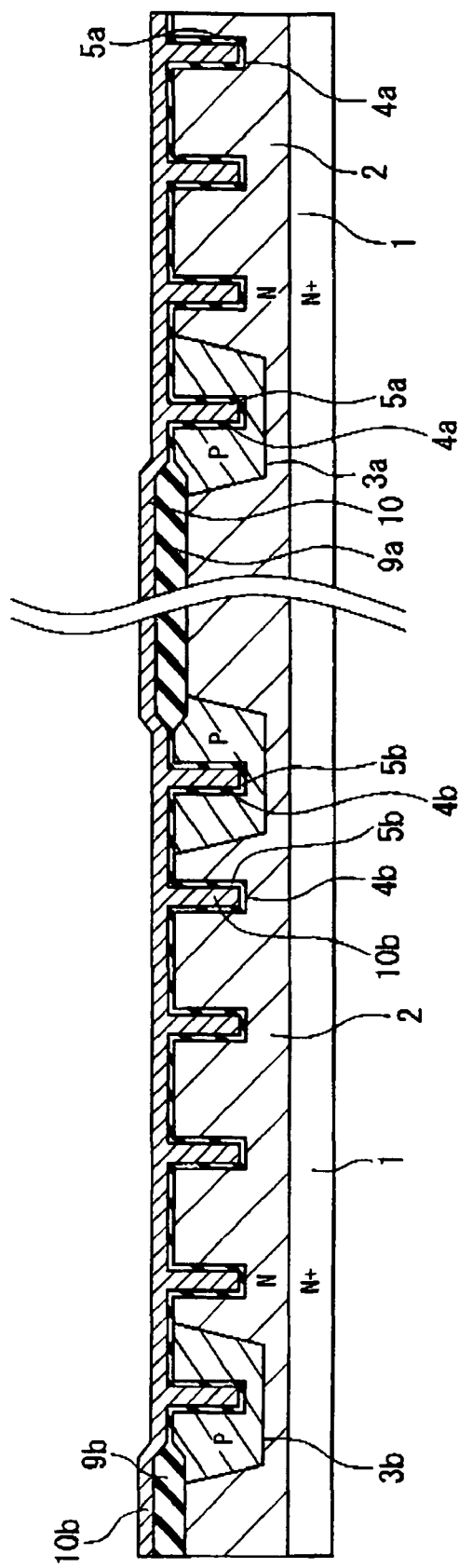
FIG. 13 is a cross sectional view showing the method of manufacturing the semiconductor device according to the first embodiment of the present invention.

As shown in FIG. 13, the gate oxidation is then performed in which the gate oxide films 5b, 5a are formed overall including the bottom and side surfaces of the trenches 4b, 4a. After that, the polycrystalline silicon layer 10 to which N-type impurities are doped is formed on the gate oxide films 5b, 5a and the field oxide films 9b, 9a.

Figure 14:
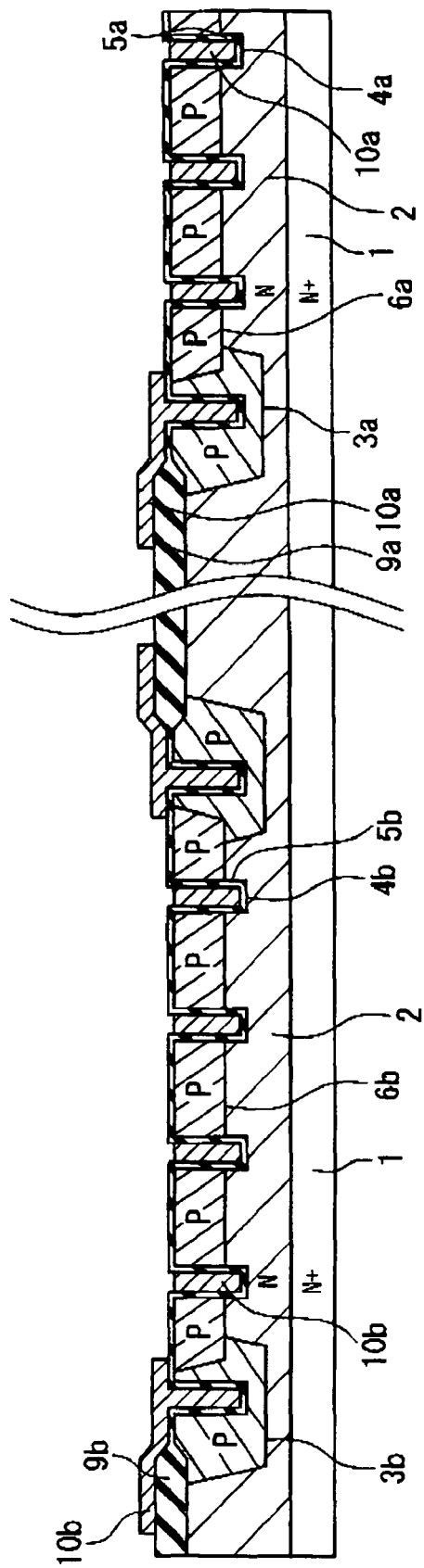
FIG. 14 is a cross sectional view showing the method of manufacturing the semiconductor device according to the first embodiment of the present invention.

As shown in FIG. 14, the polycrystalline silicon layer 10 is then etched back using patterned photoresist (not shown) as a mask to form the polycrystalline silicon layers 10b, 10a on the peripheral portion and inside of the trench 4 in the temperature detecting element region and the MOSFET region. After removing the photoresist, P-type impurities are ion-implanted using patterned photoresist (not shown) and the polycrystalline silicon layers 10b, 10a as masks to form the P-type diffusion layers 6b, 6a.

Figure 15:
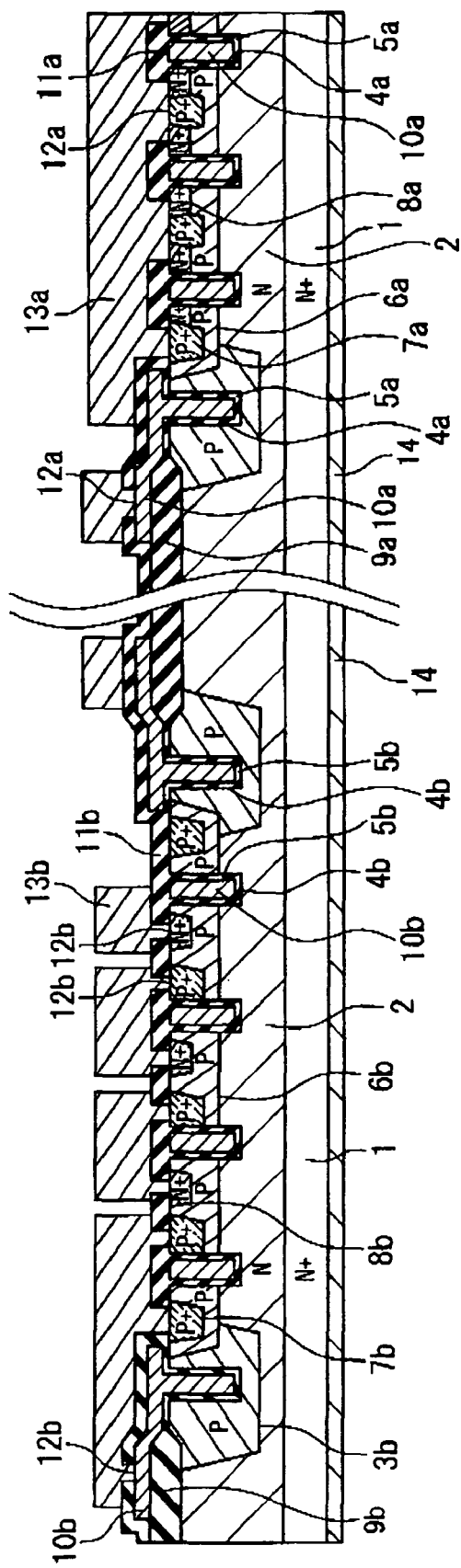
FIG. 15 is a cross sectional view showing the method of manufacturing the semiconductor device according to the first embodiment of the present invention.

As shown in FIG. 15, P-type impurities are ion-implanted to form the P-type diffusion layers 7b, 7a using patterned photoresist (not shown) as a mask. After removing the photoresist, N-type impurities are ion-implanted to form the N$^+$ diffusion layers 8b, 8a using patterned photoresist (not shown) as a mask. After removing the photoresist, the interlayer insulating-films 11b, 11a are formed. Subsequently, the interlayer insulating-films 11b, 11a are patterned, followed by forming the contact portions 12b, 12a and the aluminum electrodes 13b, 13a. A rear surface of the semiconductor chip (the N$^+$ semiconductor substrate 1) is etched to form the rear electrode 14.

In the method for manufacturing the semiconductor device according to the present embodiment, the circuit portion including the temperature detecting element can be manufactured at the same time in the same process as that of the circuit portion including the trench-gate MOSFETs. That is, only a partial change of the layout enables the circuit portion including the temperature detecting element to be simultaneously manufactured in an identical process which is performed for the circuit portion including the trench-gate MOSFETs, without adding any processes. Therefore, it is possible to manufacture the semiconductor device with the temperature detecting element at low cost and easily. In addition, using a reliable and well-established method for manufacturing the trench-gate MOSFET makes it possible to manufacture the semiconductor device with the temperature detecting element with a high degree of reliability.

Second Embodiment

Figure 16:
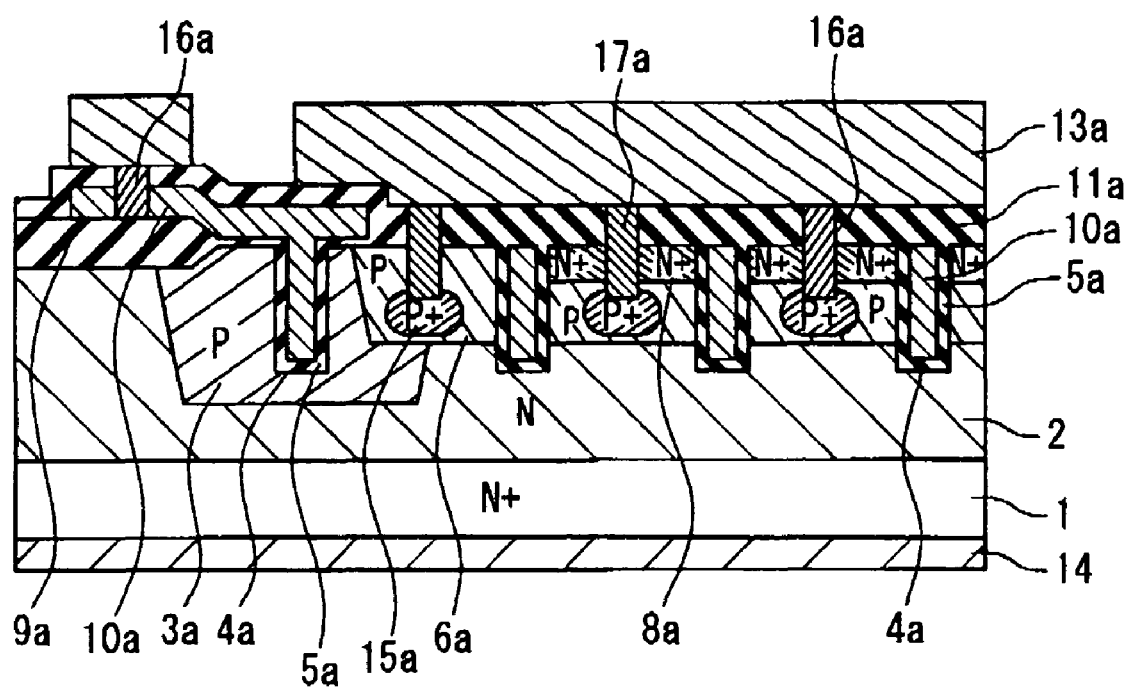
FIG. 16 is a cross sectional view showing a structure of a semiconductor device according to a second embodiment of the present invention.
Figure 17:
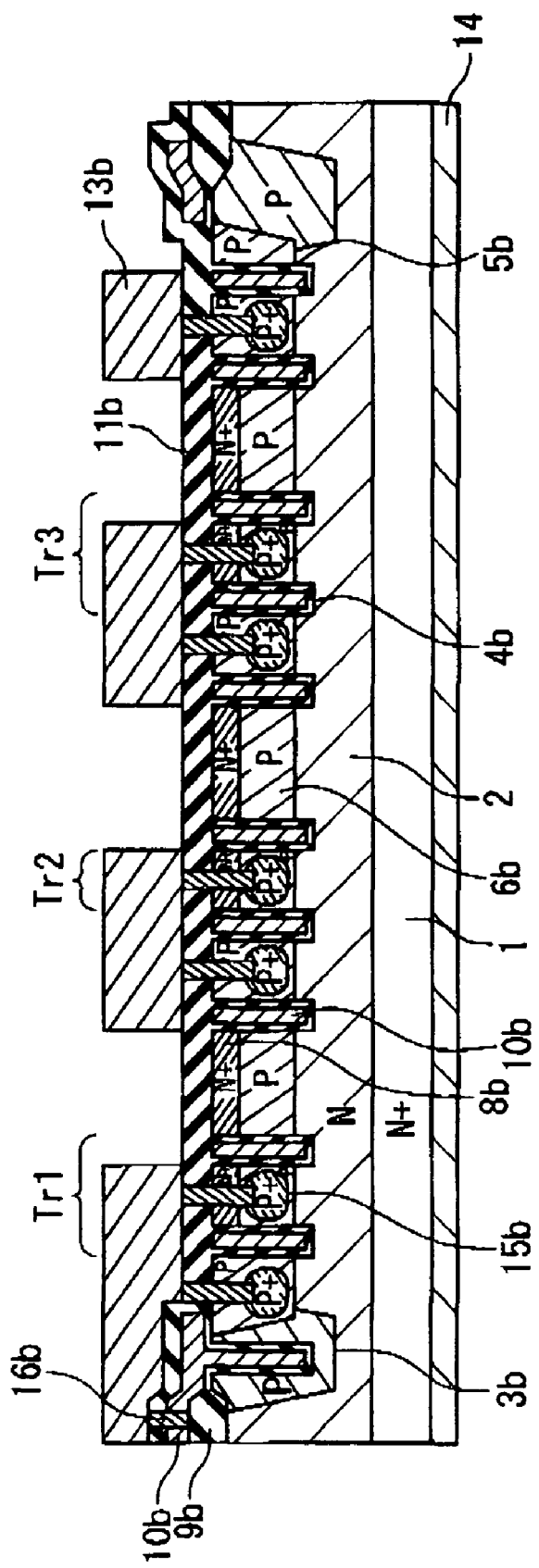
FIG. 17 is a cross sectional view showing a structure of the semiconductor device according to the second embodiment of the present invention.
Figure 18:
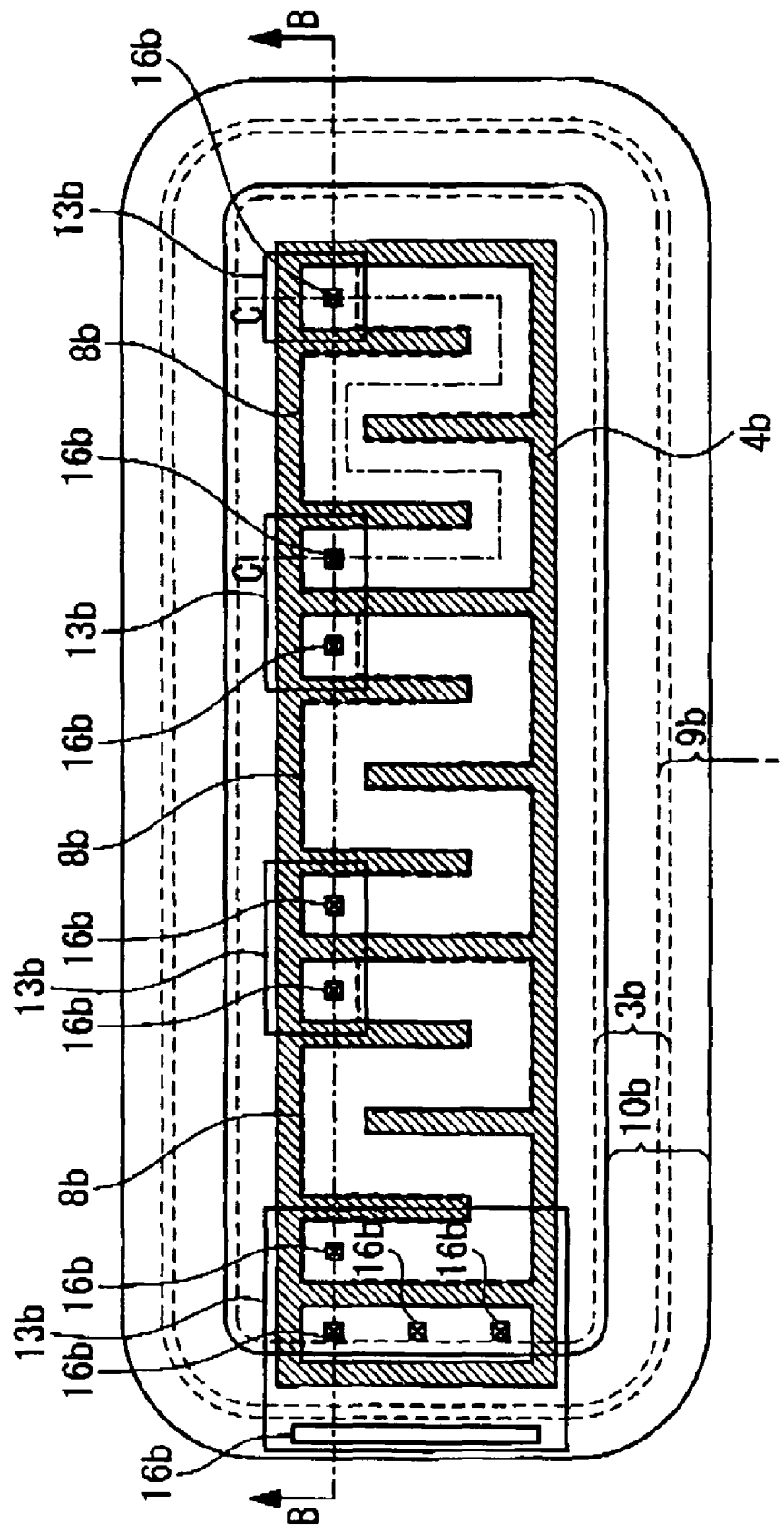
FIG. 18 is a top plan view showing a structure of the semiconductor device according to the second embodiment of the present invention.

A structure of a semiconductor device according to a second embodiment of the present invention will be described. FIGS. 16 and 17 are cross sectional views showing a structure of the semiconductor device according to the present embodiment. FIG. 18 is a top plan view showing a structure of the semiconductor device according to the present embodiment. FIG. 16 shows a circuit portion including trench-gate MOSFETs. FIGS. 17 and 18 show the same circuit portion including a temperature detecting element. FIG. 17 is a cross sectional view along the line BB' in FIG. 18. While the circuit portion including the trench-gate MOSFETs (FIG. 16) and the circuit portion including the temperature detecting element (FIG. 17) are depicted in the separate figures, they are mounted in the same semiconductor substrate (same chip). In FIGS. 16, 17 and 18, components produced in the same process are marked (numbered) similarly. However, "a" is added to each reference numeral in the circuit portion including the trench-gate MOSFETs, and "b" is added to each reference numeral in the circuit portion including the temperature detecting element.

The present embodiment differs from the first embodiment, as described below, in that a base and an emitter are electrically shorted through diffusion resistors in a plurality of bipolar transistors of the temperature detecting element, respectively.

Referring to the cross sectional view in FIG. 16 (the circuit portion including trench-gate MOSFETs), the N-type epitaxial layer 2 is formed on the N$^+$ semiconductor substrate 1. Trenches 4a are provided in the upper portion of the N-type epitaxial layer 2. A polycrystalline silicon layer 10a is buried in each trench 4a through a gate oxide film 5a. A P-well diffusion layer 3a and P-type diffusion layers 6a are formed on the N-type epitaxial layer 2. A P$^+$ diffusion layer 15a and N$^+$ diffusion layers 8a are formed in and on the P-type diffusion layer 6a, respectively.

On the peripheral portion of the circuit portion including the trench-gate MOSFETs, the field oxide film 9a is formed on the peripheral side of the P-well diffusion layer 3a. The polycrystalline silicon layer 10a is brought up to the outside surface at the peripheral portion so as to cover the surface of the junction between the N-type epitaxial layer 2 and the P-well diffusion layer 3a through the field oxide film 9a. An interlayer insulating-film 11a is formed on the polycrystalline silicon layer 10a. The interlayer insulating-film 11a and silicon (the polycrystalline silicon layer 10a and the N$^+$ diffusion layer 8a) are partially removed to form trench contact portions 16a. Inside of the circuit portion, a P$^+$ diffusion layer 15a is formed at the bottom of the trench contact portion 16a. A tungsten electrode 17a is buried in the trench contact portion 16a. An aluminum electrode 13a is formed to come into contact with the tungsten electrodes 17a. A rear electrode 14 is formed on the side of the N$^+$ semiconductor substrate 1 where the N-type epitaxial layer 2 is not formed.

The trench-gate MOSFET includes the polycrystalline silicon layer 10a (a gate) and the gate oxide film 5a, the N$^+$ diffusion layer 8a (a source) and the P-type diffusion layer 6a (a channel) on the both sides of the polycrystalline silicon layer 10a, and the N-type epitaxial layer 2 and the N$^+$ semiconductor substrate 1 (a drain). A plurality of trench-gate MOSFETs is provided in the circuit portion including the trench-gate MOSFETs.

In the trench gate MOSFET in FIG. 16, the side and bottom surfaces of the tungsten electrode 17 are electrically connected to the N$^+$ diffusion layer 8a and the P$^+$ diffusion layer 15a, respectively, so that an output portion is made finer. That is, no process is conducted to electrically contact to only the N$^+$ diffusion layers 8a. Therefore, when it is desired to mount the temperature detecting element shown in FIGS. 6 and 7, the additional process to electrically connect only the N$^+$ diffusion layers 8b is required for the manufacturing process of the trench-gate MOSFETs in FIG. 16. The present embodiment, however, avoids such process by modifying the structure of the circuit portion including the temperature detecting element. Specifically, the circuit portion including the temperature detecting element shown in FIG. 17 is only a variation of the layout of the circuit portion including the trench-gate MOSFETs shown in FIG. 16. The circuit portion including the temperature detecting element is thus manufactured by a method of manufacturing the circuit portion including the trench-gate MOSFETs. Therefore, the circuit portion including the temperature detecting element can be manufactured without adding any processes to the process of manufacturing the circuit portion including the trench gate MOSFETS, and thereby mounting them in conjunction with each other.

Referring to the cross sectional view in FIG. 17 (the circuit portion including the temperature detecting element), the N-type epitaxial layer 2 is formed on the N$^+$ semiconductor substrate 1. The trenches 4b are provided in the upper portion of the N-type epitaxial layer 2. A polycrystalline silicon layer 10b is buried in each trench 4b through a gate oxide film 5b. A P-well diffusion layer 3b and P-type diffusion layers 6b are formed on the N-type epitaxial layer 2. A P$^+$ diffusion layer 15b is formed in the P-type diffusion layer 6b. N$^+$ diffusion layers 8b are formed on the P-type diffusion layer 6b. A rear electrode 14 is formed on a side of the N$^+$ semiconductor substrate 1 where the N-type epitaxial layer 2 is not formed.

Referring to the schematic plan view in FIG. 18 (the circuit portion including the temperature detecting element), on the peripheral portion of the circuit portion, the field oxide film 9b is formed on the outer circumference of the P-well diffusion layer 3b. The polycrystalline silicon layer 10b is brought up to the outside surface at the peripheral portion so as to cover the surface of the junction between the N-type epitaxial layer 2 and the P-well diffusion layer 3b. The interlayer insulating-film 11b is formed on the polycrystalline silicon layer 10b. The interlayer insulating-film 11b and silicon (the polycrystalline silicon layer 10b and the $N^+$ diffusion layer 8b) are partially removed to form trench contact portions 16b. Inside of the circuit portion, the $P^+$ diffusion layer 15b is formed at the bottom of the trench contact portion 16b. The tungsten electrode 17b is buried in the trench contact portion 16b. The aluminum electrode 13b is formed to come into contact with the tungsten electrode 17b.

Figure 19:
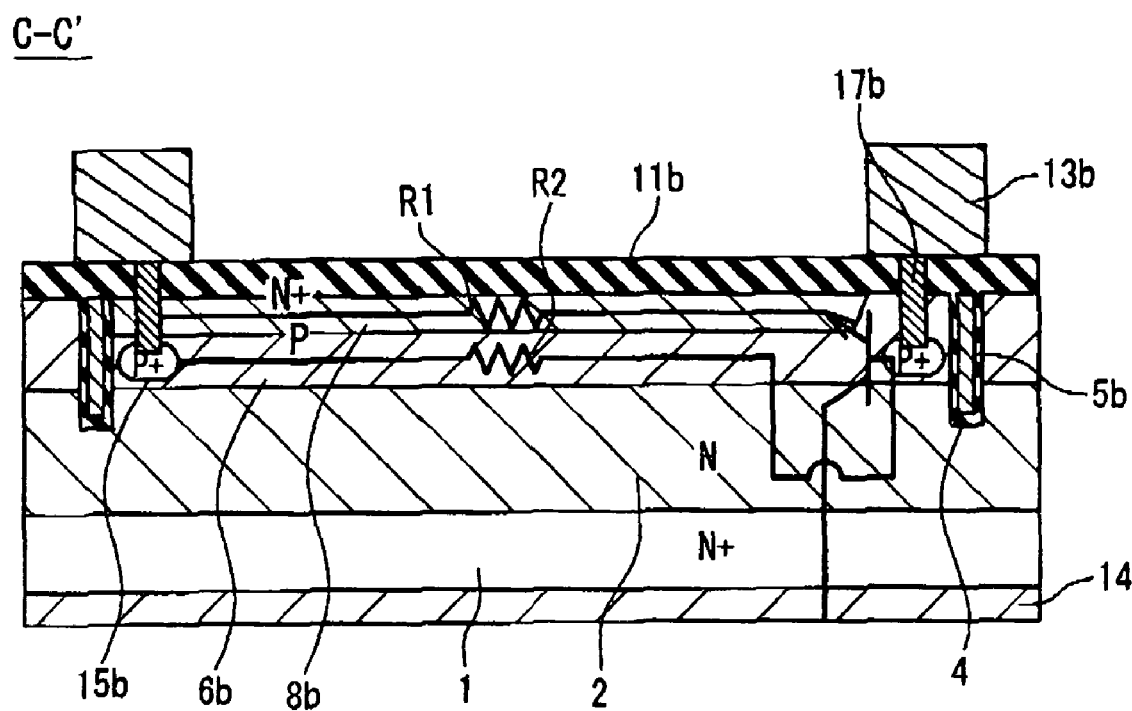
FIG. 19 is a partially enlarged cross sectional view of FIG. 18.

FIG. 19 is a partially enlarged cross sectional view along the line CC' in FIG. 18. The bipolar transistor includes the P-type diffusion layer 6b and the $P^+$ diffusion layer 15b as a base region of the bipolar transistor, the $N^+$ diffusion layer 8b as an emitter region of the bipolar transistor, and the $N^+$ semiconductor substrate 1 and the N-type epitaxial layer 2 as a collector region of the bipolar transistor. The P-type diffusion layer 6b also serves as a diffusion resistor R2 in the base portion between the adjacent bipolar transistors. Likewise, the $N^+$ diffusion layer 8b also serves as a diffusion resistor R1 in the emitter portion between the adjacent bipolar transistors. Then, the base region and the emitter region are shorted with each other through these diffusion resistors. A plurality of (three in FIG. 17) bipolar transistors is provided in the circuit portion including the temperature detecting element. The trench 4b portion (the gate oxide film 5b with the polycrystalline silicon layer 10b buried therein) serves as an element-isolation layer that electrically isolates the bipolar transistors. Therefore, the trench 4b is thus provided so as to surround the bipolar transistor. The polycrystalline silicon layer 10b buried in the trench 4b is electrically connected to the P-well diffusion layer 3b through the trench contact portion 16b, the aluminum electrode 13b, the $P^+$ diffusion layer 15b, and the P-type diffusion layer 6b.

Applying a current to the temperature detecting element raises a base potential thanks to the diffusion resistor R2 in the base portion, and the bipolar transistor is activated at or over a certain current level. In the present embodiment, the diffusion resistor R1 (the $N^+$ diffusion layer 8b) is set 75 μm in length and 2 μm in width so that the bipolar transistor is activated at the current value of 10 μA. A larger ratio of the length to the width of the diffusion resistor R1 leads to the activation of the bipolar transistor with a lower current.

Figure 20:
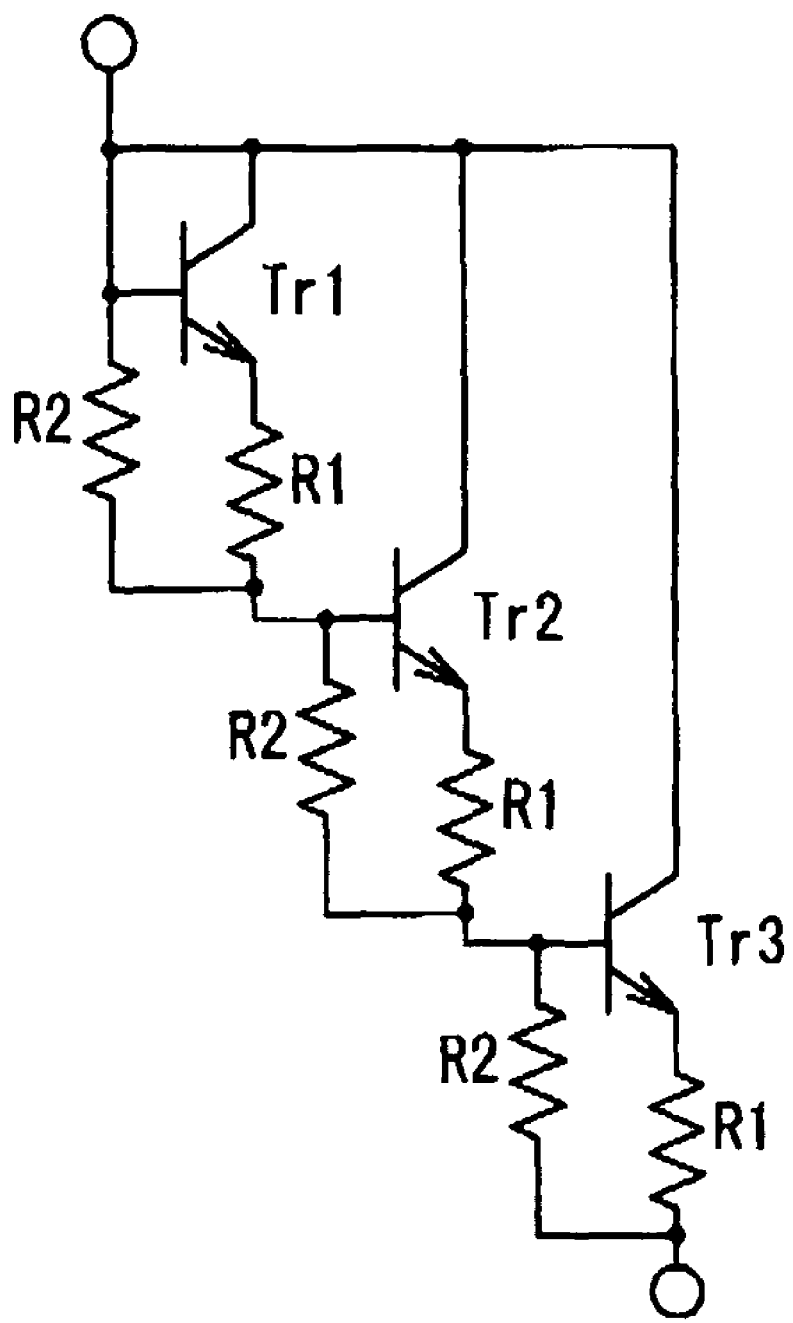
FIG. 20 is a circuit diagram showing an equivalent circuit of the temperature detecting element in FIG. 17.
Figure 21:
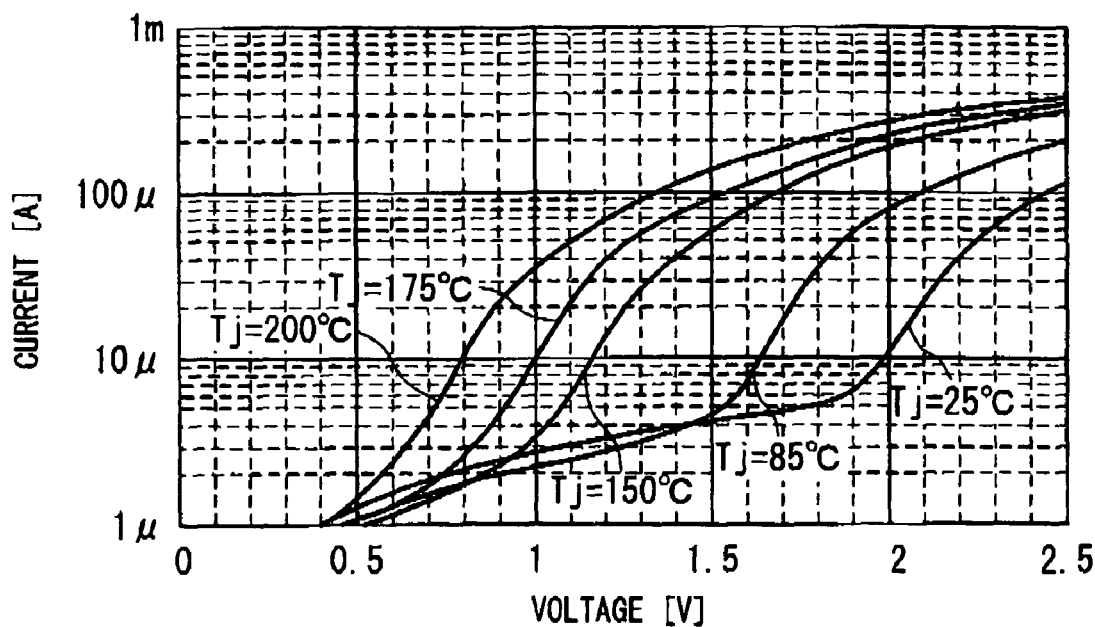
FIG. 21 is a graph showing a voltage-current characteristic of the temperature detecting element in FIG. 17.
Figure 22:
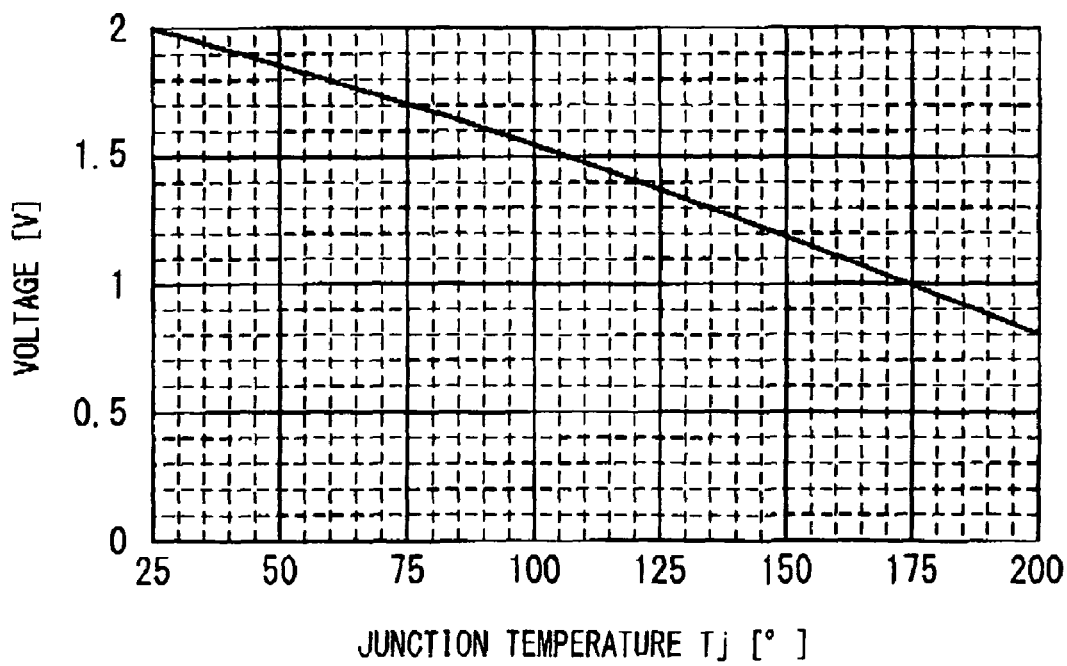
FIG. 22 is a graph showing the temperature characteristic of a voltage of the temperature detecting element in FIG. 17.

FIG. 20 is a circuit diagram showing an equivalent circuit of the temperature detecting element in FIG. 17. The temperature detecting element has a structure in which the bipolar transistors are in 3-stage Darlington connection. In each bipolar transistor of the temperature detecting element, the base and the emitter are electrically shorted through the diffusion resistors R1 and R2. The temperature detecting element utilizes a voltage-current characteristic of the bipolar transistors in the 3-stage Darlington connection. FIG. 21 is a graph showing a voltage-current characteristic of this temperature detecting element. The temperature detecting element detects the temperature by measuring a voltage when a certain constant current is applied. FIG. 22 is a graph showing the temperature characteristic of the voltage of this temperature detecting element when the current is 10 μA. The figure shows that the voltage varies linearly with respect to the temperature.

As shown in FIGS. 17 and 18, the polycrystalline silicon layer 10b on the peripheral side acts as a field plate. This improves the withstand voltage of the surface of the junction between the N-type epitaxial layer 2 and the P-well diffusion layer 3b. Therefore, even if mobile ions penetrate into the chip surface, it does not lower the withstand voltage of this portion. In addition, the junction between the N-type epitaxial layer 2 and the P-type diffusion layer 6b does not exist on the chip surface due to the existence of the trench 4b as a device isolation layer. Therefore, even if mobile ion penetrate into the chip surface, it does not lower the withstand voltage of this portion.

The withstand voltage for the isolation between the P-type diffusion layers 6b, which is electrically isolated by the trench 4b (serving as an device isolation layer), is determined by the punch-through withstand voltage of PNP junction in the order of the P-type diffusion layer 6b, the N-type epitaxial layer 2, and the P-type diffusion layer 6b. This withstand voltage for the isolation may be a dozen or so volts. Such withstand voltage is insufficient to isolate all devices, while it is sufficient to isolate the temperature detecting element whose potential difference is in the order of several volts.

As described above, also in the temperature detecting element according to the present embodiment, the field plate is provided so as to entirely surround a plurality of bipolar transistors, and thus no field plate is needed to be provided for each bipolar transistor. This provides the effect that the layout area as the temperature detecting element can be reduced. In addition, the trench 4b provides insulation between the bipolar transistors, thereby enabling the insulation in a small area. Therefore, an effect is obtained that the layout area can be further reduced.

A method of manufacturing the semiconductor device according to the present embodiment is essentially same as described with regard to FIGS. 11 to 15. The difference therebetween can be addressed by a conventionally known method, so that the detail thereof is omitted. The present embodiment also can provide the same effects as those obtained by the first embodiment.

Figure 23:
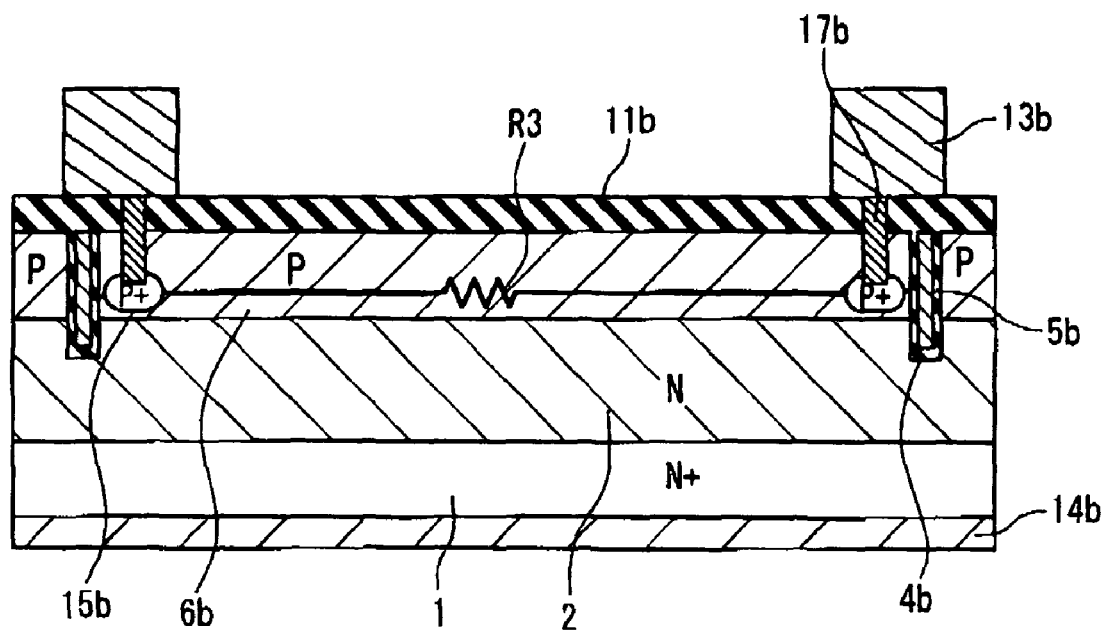
FIG. 23 is a cross sectional view showing an example of the P-type diffusion layer as being a diffusion resistor electrically isolated by the trench.

In the respective embodiments described above, the diffusion layers are separated between the bipolar transistors (the temperature detecting elements) by the trench element-isolation layer. However, the devices electrically isolated by the trench are not limited to the bipolar transistor and the temperature detecting element. The devices available at the withstand voltage of a dozen or so volts or less can be electrically isolated by the trench. FIG. 23 is a cross sectional view showing an example of the P-type diffusion layer as a diffusion resistor electrically isolated by the trench. In this case, the $N^+$ diffusion layer 8 is not formed by covering a certain location with a resist (the $N^+$ impurities are not ion-implanted), as compared to FIG. 19. Specifically, the reference numeral 6b in FIG. 23 is the P-type diffusion layer (the second diffusion layer) that is formed simultaneously with the MOSFET P-type diffusion layer 6a (the first diffusion layer), and the reference numeral 15b in FIG. 23 is the $P^+$ diffusion layer (the forth diffusion layer) that is formed simultaneously with the MOSFET $P^+$ diffusion layer 15a (the third diffusion layer) in FIG. 16. Such diffusion resistor can be used as the resistor 51 in FIG. 8 of JP-B 3,413,569 (connected between a source of the trench MOSFET 30 and a source of the trench MOSFET 31 for detecting the current).

As described above, forming the element-isolation layer of the protection element in the same manufacturing process as that of the MOSFET trench gate can provide the semiconductor device with a smaller layout area for the protection element without adding any processes.

The conduction types of the diffusion layers described above (N-type and P-type) are only examples and all combinations may be reversed. Further, the embodiments described above show the examples in which the polycrystalline silicon layer formed in the trench gate and the element-isolation layer is formed up to a surface of the trench. However, the polycrystalline silicon layer may be etched back to a position lower than the surface of the trench to fill the trench between the polycrystalline silicon layer and the surface of the trench with the interlayer isolation film. Furthermore, although the above embodiments have been described taking the MOSFET as an example, those are available for use in the trench gate IGBT (the insulated gate bipolar transistor). It can be considered that the IGBT includes the collector region that has the conductivity type opposite to that of the above-mentioned MOSFET under the drain region thereof. Specifically, the trench gate of the MOSFET corresponds to the trench gate of the IGBT, the channel (the base region) of the MOSFET corresponds to the emitter region of the IGBT, the drain region of the MOSFET corresponds to the base region of the IGBT, and the source region of the MOSFET corresponds to a diffusion region of the IGBT that has the conductivity type opposite to that of the emitter region to be connected by the emitter electrode. As described above, according to the present invention, the trench gate of the IGBT and the element-isolation layer of the electronic element can be formed simultaneously, and the diffusion layer of the IGBT and the diffusion layer of the electronic devices can be formed simultaneously.

It is apparent that the present invention is not limited to the embodiments described above, and modification or variation can be appropriately made to the embodiments within the scope of a technical idea of the present invention. Moreover, the embodiments and the portions thereof can be mutually utilized unless any technically contradictions occur.

Although the present invention has been described above in connection with several exemplary embodiments thereof, it would be apparent to those skilled in the art that those exemplary embodiments are provided solely for illustrating the present invention, and should not be relied upon to construe the appended claims in a limiting sense.

What is claimed is:

1. A semiconductor device, comprising:
   an insulated-gate FET (Field Effect Transistor); and
   an electronic element,
   wherein said insulated-gate FET includes:
      a trench gate formed in a semiconductor base;
      a first diffusion layer formed on a side of said trench gate; and
      a third diffusion layer formed in said first diffusion layer,
   wherein said electronic element includes:
      a second diffusion layer having an approximately a same impurity concentration and depth profile as said first diffusion layer;
      a fourth diffusion layer having an approximately a same impurity concentration and depth profile as said third diffusion layer, and formed in said second diffusion layer;
      a top diffusion layer, different from said fourth diffusion layer, formed in said second diffusion layer, said top diffusion layer covering an exposed area of said second diffusion layer; and
      a trench element-isolation layer having an approximately a same depth as said trench gate, and formed so as to surround said second diffusion layer,
   wherein each of said trench gate and said trench element-isolation layer includes:
      an insulating layer formed in a trench; and
      a conductive layer buried in said insulating layer.

2. The semiconductor device according to claim 1, wherein said electronic element includes:
   a plurality of functional elements,
   wherein each of said plurality of functional elements includes:
      said second diffusion layer; and
      said fourth diffusion layer,
   wherein said trench element-isolation layer is formed to surround each of said plurality of functional elements.

3. The semiconductor device according to claim 2, wherein said conductive layer included in said trench element-isolation layer is electrically connected with at least one of said second diffusion layer.

4. The semiconductor device according to claim 1, further comprising:
   a field oxide film formed in a region surrounding said trench element-isolation layer; and
   a fifth diffusion layer formed inside said field oxide film,
   wherein a part of said trench element-isolation layer is formed in said fifth diffusion layer, and
   wherein said conductive layer included in said trench element-isolation layer is extended on said fifth diffusion layer and said field oxide film.

5. The semiconductor device according to claim 2, wherein said plurality of functional elements includes:
   a plurality of bipolar transistors,
   wherein said second diffusion layer is formed as a base region of each of said plurality of bipolar transistors, and
   wherein said fourth diffusion layer is formed as an emitter region of said each of said plurality of bipolar transistors.

6. The semiconductor device according to claim 5, wherein said plurality of bipolar transistors is in a Darlington connection.

7. The semiconductor device according to claim 6, wherein said plurality of bipolar transistors is connected with each other so that said base region and said emitter region are electrically shorted through diffusion resistors.

8. The semiconductor device according to claim 5, wherein said plurality of bipolar transistors comprises a temperature detecting element which detects a temperature of said insulated-gate FET.

9. The semiconductor device according to claim 1, further comprising:
   another top diffusion layer formed in said first diffusion layer adjacent to said third diffusion layer, said another top diffusion layer covering an exposed area of said first diffusion layer.

10. The semiconductor device according to claim 1, further comprising:
    an electrode disposed above said top diffusion layer and said fourth diffusion layer, said top diffusion layer and said fourth diffusion layer spacing apart an entirety of said exposed area of said second diffusion layer from said electrode.

11. A semiconductor device, comprising:
    an insulated-gate FET (Field Effect Transistor); and
    a plurality of electronic elements,
    wherein said insulated-gate FET comprises:
       a trench gate formed in a semiconductor base;
       a first diffusion layer formed on a side of said trench gate; and
       a third diffusion layer formed in said first diffusion layer,
    wherein each of said electronic elements comprises:
       a second diffusion layer having an approximately same impurity concentration and depth profile as said first diffusion layer;
       a fourth diffusion layer having an approximately a same impurity concentration and depth profile as said third diffusion layer, and formed in said second diffusion layer; a top diffusion layer, different from said fourth diffusion layer, formed in said second diffusion layer; and a trench element-isolation layer having an approximately same depth as said trench gate, and formed so as to surround said second diffusion layer, and wherein each of said trench gate and said trench element-isolation layer includes:

an insulating layer formed in a trench; and a conductive layer buried in said insulating layer.

12. The semiconductor device according to claim 11, wherein one of said trench element-isolation layer in one of said electronic elements and another of said trench element-isolation layer in another of said electronic elements form a single trench element-isolation layer.

13. The semiconductor device according to claim 12, wherein said conductive layer included in said single trench element-isolation layer is electrically connected with at least one of said second diffusion layer.

14. The semiconductor device according to claim 11, further comprising:

a field oxide film formed in a region surrounding said trench element-isolation layer; and a fifth diffusion layer formed inside said field oxide film, wherein a part of said trench element-isolation layer is formed in said fifth diffusion layer, and wherein said conductive layer included in said trench element-isolation layer is extended on said fifth diffusion layer and said field oxide film.

15. The semiconductor device according to claim 12, wherein said plurality of electronic elements comprises:

a plurality of bipolar transistors, wherein said second diffusion layer is formed as a base region of each of said plurality of bipolar transistors, and wherein said fourth diffusion layer is formed as an emitter region of said each of said plurality of bipolar transistors.

16. The semiconductor device according to claim 15, wherein said plurality of bipolar transistors is in a Darlington connection.

17. The semiconductor device according to claim 16, wherein bipolar transistors of said plurality of bipolar transistors are connected with each other such that said base region and said emitter region are electrically shorted through diffusion resistors.

18. The semiconductor device according to claim 15, wherein said plurality of bipolar transistors comprises a temperature detecting element which detects a temperature of said insulated-gate FET.

19. The semiconductor device according to claim 11, wherein each of said electronic elements further comprises:

a top diffusion layer formed in said second diffusion layer spaced apart from said fourth diffusion layer, said top diffusion layer covering an exposed area of said second diffusion layer.

20. The semiconductor device according to claim 11, wherein said insulated-gate FET further comprises:

another top diffusion layer formed in said first diffusion layer adjacent to said third diffusion layer, said another top diffusion layer covering an exposed area of said first diffusion layer.

* * * * *